US009990005B2

(12) United States Patent
An et al.

(10) Patent No.: US 9,990,005 B2
(45) Date of Patent: Jun. 5, 2018

(54) DISPLAY DEVICE AND ELECTRONIC DEVICE HAVING DRAINAGE STRUCTURE

(71) Applicant: S-PRINTING SOLUTION CO., LTD., Suwon-si, Gyeonggi-do (KR)

(72) Inventors: Hwi-kyeong An, Seoul (KR); Sung-weon Song, Yongin-si (KR)

(73) Assignee: S-PRINTING SOLUTION CO., LTD., Suwon-si (KR)

( * ) Notice: Subject to any disclaimer, the term of this patent is extended or adjusted under 35 U.S.C. 154(b) by 112 days.

(21) Appl. No.: 15/047,180

(22) Filed: Feb. 18, 2016

(65) Prior Publication Data

US 2017/0023981 A1 Jan. 26, 2017

(30) Foreign Application Priority Data

Jul. 23, 2015 (KR) .......................... 10-2015-0104596

(51) Int. Cl.
*G06F 3/042* (2006.01)
*G06F 3/041* (2006.01)
(Continued)

(52) U.S. Cl.
CPC ............. *G06F 1/1656* (2013.01); *G02B 6/10* (2013.01); *G02B 27/0172* (2013.01); *G02F 1/133308* (2013.01); *G06F 1/1643* (2013.01); *G06F 3/0412* (2013.01); *G06F 3/0421* (2013.01); *H05K 5/0213* (2013.01); *G02F 1/13338* (2013.01); *G06F 2203/04103* (2013.01)

(58) Field of Classification Search
CPC ........ G06F 3/017; G06F 3/041; G06F 3/0412; G06F 3/0421; G06F 2203/04103; G06F 1/1643; G06F 1/1656; G02B 27/0172; G02B 6/10; G02F 1/1333; G02F 1/13338; G02F 1/133308; G09G 3/3473; H05K 5/0213
See application file for complete search history.

(56) References Cited

U.S. PATENT DOCUMENTS 5,353,536 A * 10/1994 Erber ................. G09F 15/0012
40/606.09
6,152,550 A * 11/2000 Yamaguchi .......... G07G 1/0018
312/223.2
(Continued)

FOREIGN PATENT DOCUMENTS

EP 2 825 007 A2 1/2015
JP 10-198500 7/1998
(Continued)

OTHER PUBLICATIONS

Extended European Search Report dated Jan. 17, 2017 in corresponding European Patent Application No. 16161960.6.

*Primary Examiner* — Dismery Mercedes
(74) *Attorney, Agent, or Firm* — Staas & Halsey LLP

(57) ABSTRACT

A display device makes a touch input through interception of light that passes through a touch area on a display panel defined by an optical guide portion. The display device includes a gap formed between at least one side end portion of the display panel and the optical guide portion surrounding the display panel, and the optical includes at least one drainage hole and a drainage path configured to guide a liquid that flows into the gap to the drainage hole.

20 Claims, 18 Drawing Sheets

(51) Int. Cl.
*G06F 1/16* (2006.01)
*H05K 5/02* (2006.01)
*G02F 1/1333* (2006.01)
*G02B 27/01* (2006.01)
*G02B 6/10* (2006.01)

(56) References Cited

U.S. PATENT DOCUMENTS

| | | | | |
|---|---|---|---|---|
| 7,838,784 | B2* | 11/2010 | Arisaka | G06F 1/1616 |
| | | | | 200/302.1 |
| 9,678,601 | B2* | 6/2017 | Pettersson | G06F 3/042 |
| 2006/0098136 | A1* | 5/2006 | Masunaga | G02F 1/133308 |
| | | | | 349/58 |
| 2007/0188675 | A1* | 8/2007 | Tsubokura | G02F 1/133308 |
| | | | | 349/58 |
| 2010/0246157 | A1* | 9/2010 | Kurahashi | H05K 5/02 |
| | | | | 361/829 |
| 2010/0307841 | A1* | 12/2010 | Wu | G06F 3/039 |
| | | | | 178/19.01 |
| 2012/0327327 | A1* | 12/2012 | Joo | H05K 1/189 |
| | | | | 349/58 |
| 2013/0021302 | A1* | 1/2013 | Drumm | G06F 3/0421 |
| | | | | 345/175 |
| 2013/0163200 | A1* | 6/2013 | Takahashi | H05K 5/0213 |
| | | | | 361/692 |
| 2013/0171921 | A1* | 7/2013 | Nakamichi | H05K 5/0213 |
| | | | | 454/184 |
| 2013/0285809 | A1* | 10/2013 | Sekiyama | G08B 21/20 |
| | | | | 340/540 |
| 2015/0016053 | A1 | 1/2015 | Donner | |
| 2015/0212601 | A1* | 7/2015 | Zerayohannes | G06F 3/03545 |
| | | | | 345/179 |

FOREIGN PATENT DOCUMENTS

| | | |
|---|---|---|
| JP | 2000-194486 | 7/2000 |
| JP | 2002-373512 | 12/2002 |
| JP | 2011-239139 | 11/2011 |
| JP | 2013-125316 | 6/2013 |
| WO | WO 2013/138003 A1 | 9/2013 |

* cited by examiner

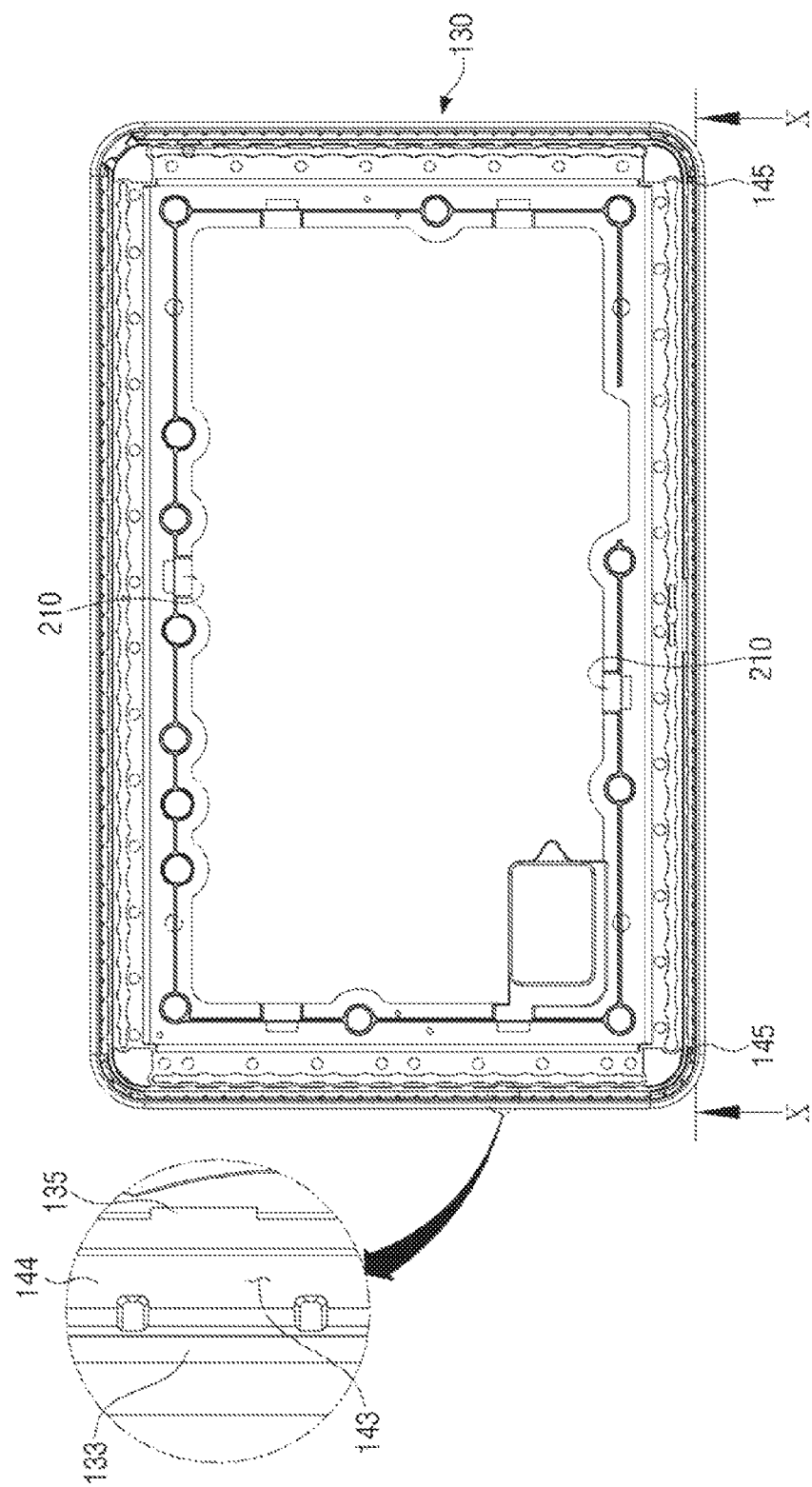

DISPLAY DEVICE AND ELECTRONIC DEVICE HAVING DRAINAGE STRUCTURE

CROSS-REFERENCE TO RELATED APPLICATIONS

This application claims benefit of foreign priority from Korean Patent Application No. 10-2015-0104596 filed on Jul. 23, 2015 in the Korean Intellectual Property Office, the disclosure of which is incorporated herein by reference in its entirety.

BACKGROUND

1. Field

The present disclosure relates to a display device and an electronic device, and more particularly, to a display device and an electronic device having an infrared touch screen panel and using a housing frame as an optical guide portion.

2. Related Art

In general, a touch screen panel (TSP) is an input device which, if a user presses or contacts a screen with a finger or a pen, recognizes the position of such pressing or touch and transfers the recognized position information to the system. With the spread of smart phones, the TSP has been widely expanded.

The TSP is composed of a touch panel, a controller IC (Integrated Circuit), and driver software, and the touch panel is composed of an upper plate and a lower plate (film or glass), on which ITO (Indium Tin Oxide) is deposited, and serves to grasp the position of signal occurrence that is caused by the contact occurrence or electrical capacitance change and to transfer the grasped position information to the controller IC. The controller IC serves to change an analog signal that is transferred from the touch panel in the form of coordinates that can be presented on the screen through conversion of the analog signal into a digital signal, and the driver software is a control program that implements the touch panel to match the operating systems through reception of the digital signal output from the controller IC.

In accordance with an application technology, the TSP may be classified into a resistance film type, a capacitance type, an ultrasonic type, an infrared type, and an optical type.

The infrared type TSP is a touch screen panel that uses the linearity of infrared rays. The infrared rays that strike an obstacle are intercepted. The infrared type TSP has a matrix structure in which a plurality of light emitting elements LED that emit infrared rays and a plurality of light receiving elements (photodiodes) that respectively correspond to the light emitting elements are arranged to face each other around the panel. If a finger (or a predetermined shape that can make a shadow, for example, an object that is thin and long, such as a bar, a pencil, or a brush (hereinafter referred to as an "object having a predetermined shape") touches the screen to intercept light, an output of the intercepted portion is deteriorated, and X, Y coordinates of the portion is obtained to determine input coordinates. In this case, a finger or an object having a predetermined shape may be used as an input device. The infrared type TSP has the advantages of high light permeation, high durability, and applicability to a large screen, but also has the drawbacks of high manufacturing cost, low slimming, and low resolution. The infrared type TSP is mainly applied to an ATM device or a kiosk.

According to the display device in the related art that adopts the infrared type TSP, gaps are formed between the light emitting elements and the light emitting elements due to assembly tolerance between the light emitting elements, assembly tolerance between the light receiving elements, and assembly tolerance occurring when the light emitting elements and the light receiving elements are assembled on the PCB. Due to such gaps, a blind zone in which no light exists occurs, and thus even if the finger or the object having the predetermined shape is positioned in the blind zone, the coordinate values may not be properly recognized.

In order to solve this problem, the infrared type TSP in the related art adopts an optical guide portion on which a light diffusion lens is formed. In particular, the infrared type TSP, as illustrated in FIG. 1, is configured so that an optical guide portion 3 of a display device 1 also serves as a support frame that can maintain the strength of the display device 1. Accordingly, the depth of a touch area is minimized to resolve the visual drawbacks, and the number of components is reduced to save the manufacturing cost.

However, in the case of adopting the optical guide portion 3 having the structure as illustrated in FIG. 1, liquid drops D, which may occur due to water or coffee that is spilled on a touch screen panel 5, may be driven onto a corner portion on which the optical guide portion 3 and the touch screen panel 5 meet each other, or may stick to a projection surface 4 of the optical guide portion 3. In this case, light that is emitted from the projection surface 4 of the optical guide portion 3 may interfere with the liquid drops and thus may be unwantedly dispersed in an unspecified direction to cause the occurrence of malfunction.

Further, as another example of malfunction, if foreign substances, such as dust, are accumulated on the corner portion on which the optical guide portion 3 and the touch screen panel 5 meet each other, the projection surface 4 of the optical guide portion 3 may be hidden by the accumulated foreign substances, and thus the light that is emitted from the projection surface 4 is physically intercepted to cause the occurrence of malfunction.

In FIG. 1, unexplained reference numeral "2" denotes a rear cover, "7" denotes a PCB, "8" denotes a light emitting element, and "9" denotes a light receiving element.

SUMMARY

Exemplary embodiments of the present disclosure overcome the above disadvantages and other disadvantages not described above, and provide a display device and an electronic device having a drainage structure capable of draining a liquid that is spilled on a display panel out of the display device.

Exemplary embodiments of the present disclosure also provide a display device and an electronic device having a foreign substance removing member capable of effectively removing foreign substances that are accumulated on a corner portion on which an optical guide portion and a display panel meet each other.

According to an aspect of the present disclosure, a display device configured to make a touch input through interception of light that passes through a touch area on a display panel defined by an optical guide portion, wherein a gap is formed between at least one side end portion of the display panel and the optical guide portion surrounding the display panel, and the optical guide portion comprises at least one drainage hole and a drainage path configured to guide a liquid that flows into the gap to the drainage hole.

The optical guide portion may be in various shapes, and the at least one drainage hole may be formed on one portion of the optical guide portion.

A rear cover that forms a rear portion of the display device may have a drainage guide groove formed thereon to correspond to the at least one drainage hole.

The drainage path may have a furrow structure that is formed by an outer wall that forms an outline of the optical guide portion and an inner wall of the optical guide portion that is arranged at an interval from the outer wall.

The drainage path may have a plurality of micro-projections formed on a bottom of the drainage path, and it is preferable that the plurality of micro-projections have upper portions that are in the form of a round or a cone to minimize a contact area with liquid drops.

The drainage path may have a bottom surface that is downwardly inclined toward the at least one drainage hole.

The display device according to the aspect of the present disclosure may further include at least one vibrator that vibrates the display panel. In this case, the at least one vibrator may be fixedly installed on a frame portion that supports the display panel, or may be fixedly installed on the optical guide portion.

The display device according to the aspect of the present disclosure may further include a plurality of resonance ribs formed on a part of a frame portion that is arranged between the optical guide portion and the display panel, wherein the plurality of resonance ribs resonate with sound waves generated from a speaker that is arranged inside the display device to vibrate the optical guide portion.

The display device according to the aspect of the present disclosure may further include a foreign substance removing member configured to remove foreign substances accumulated on a corner portion on which the optical guide portion and the display panel meet each other, wherein the foreign substance removing member is separably inserted into the display device.

The foreign substance removing member may have a scraper provided at one end portion thereof, and the scraper may have an inclined contact end. It is preferable that the scraper is made of a flexible material.

The foreign substance removing member may have a writing portion provided at the other end portion thereof and having a pressure-function.

According to another aspect of the present disclosure, an electronic device configured to make a touch input through interception of light that passes through a touch area on a display panel defined by an optical guide portion, includes a drainage structure configured to discharge a liquid that is spilled onto the display panel to an outside of the electronic device through an interior of the electronic device, wherein the drainage structure includes a gap formed between the display panel and the optical guide portion surrounding the display panel, at least one drainage hole formed on the optical guide portion, and a drainage path configured to guide the liquid that flows into the gap to the drainage hole.

Additional and/or other aspects and advantages of the disclosure will be set forth in part in the description which follows and, in part, will be obvious from the description, or may be learned by practice of the disclosure.

BRIEF DESCRIPTION OF THE DRAWINGS

The above and/or other aspects of the present disclosure will be more apparent by describing certain exemplary embodiments of the present disclosure with reference to the accompanying drawings, in which:

FIG. 8 is a front view illustrating an optical guide portion illustrated in FIG. 4;

DESCRIPTION OF EMBODIMENTS

Figure 1:
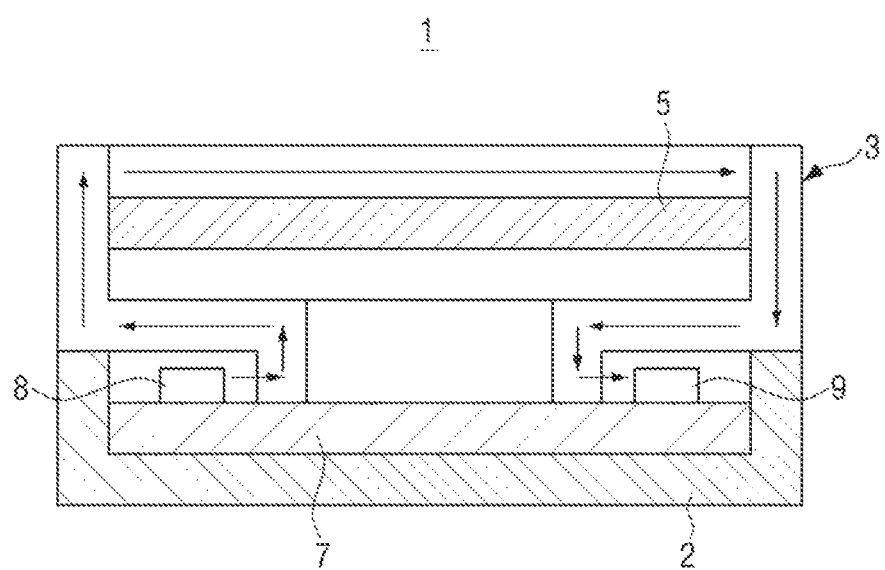
FIG. 1 is a schematic cross-sectional view illustrating a display device having an infrared touch screen panel in the related art.
Figure 2:
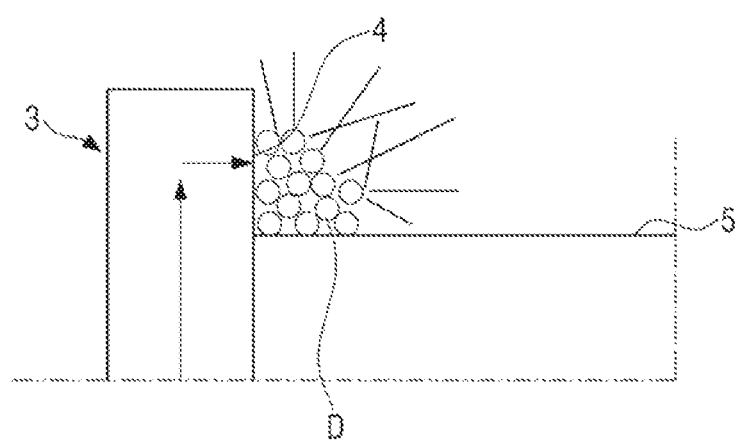
FIG. 2 is an enlarged view illustrating portion II indicated in FIG. 1.

Hereinafter, various exemplary embodiments of the present disclosure will be described with reference to the accompanying drawings. Further, in order to help understanding of the present disclosure, in the accompanying drawings, dimensions of some constituent elements may be illustrated exaggeratedly.

The present disclosure may correspond to a display device having an infrared type TSP (Touch Screen Panel) and an electronic device. The present disclosure may include a drainage structure and a foreign substance removing portion which can effectively remove liquid and foreign substances that may cause a touch error of the infrared type TSP from a touch area of a display panel.

Hereinafter, referring to FIGS. 3 to 13, the overall structure of a display device according to an embodiment of the present disclosure will be briefly explained, and a drainage structure and various configurations that help smooth drainage will be successively explained.

A display device 100 according to an embodiment of the present disclosure may include a display panel 110, an optical guide portion 130, a frame portion 150, a printed circuit board 170, light emitting elements 171, light receiving elements 173, a rear cover 190, a vibrator 210, and a foreign substance removing member 300.

Figure 3:
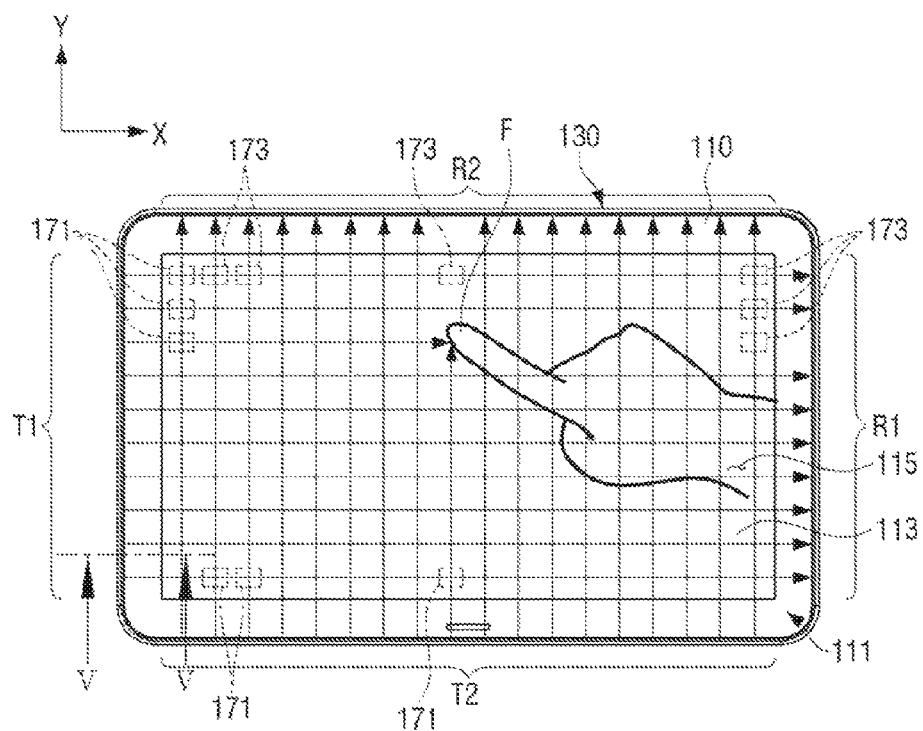
FIG. 3 is a front view illustrating a display device according to an exemplary embodiment of the present disclosure.

Referring to FIG. 3, the display panel 110 may be composed of a touch screen panel that recognizes a touch input using infrared rays. The display panel 110 is substantially in a rectangular shape, and a display area 113 is partitioned inside a bezel 111. In this case, a touch area 115 may be formed with a predetermined height from an outer surface of the display panel 110. The touch area 115 is a three-dimensional (3D) space in which an optical matrix is formed by light that is emitted from a plurality of light emitting elements 171 arranged on a left side T1 and a lower side T2 of the display device 100. For example, if a user's finger F enters into the touch area 115, the light emitted from the light emitting elements 171 is intercepted by the finger F, and if the light is not incident to the light receiving elements 173 corresponding to the light emitting elements 171, X, Y coordinates of the corresponding position may be recognized as a touch position.

Figure 4:
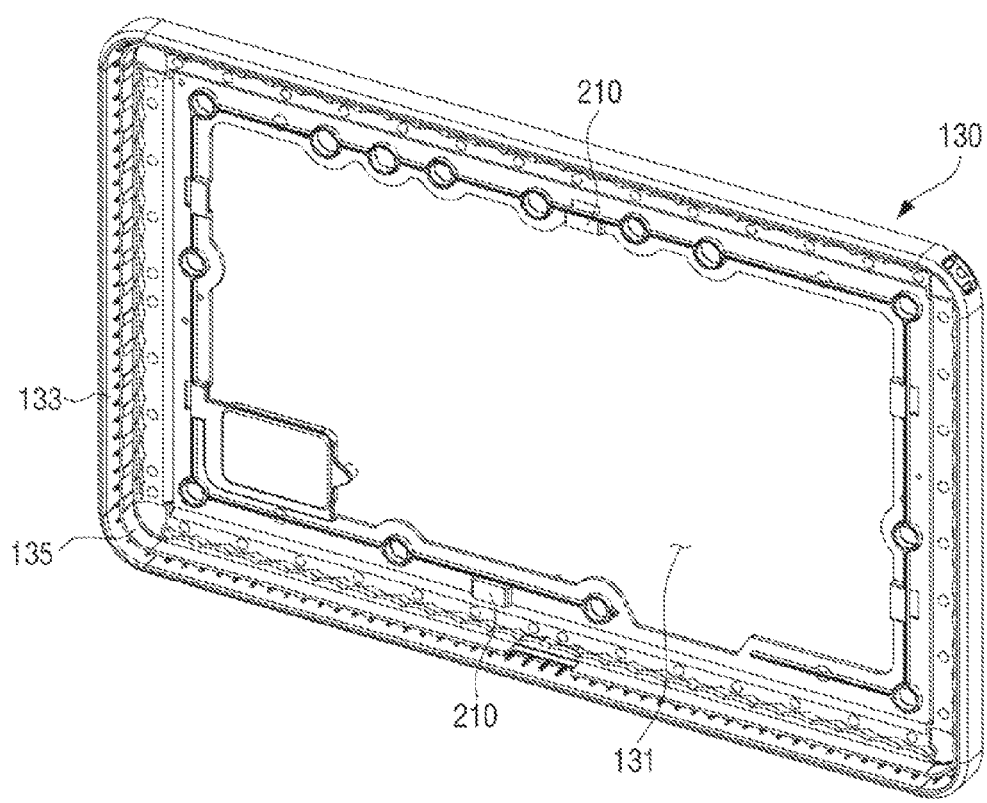
FIG. 4 is a perspective view illustrating an optical guide portion of a display device according to an exemplary embodiment of the present disclosure.

Referring to FIG. 4, the optical guide portion 130 may guide the light that is emitted from the plurality of light emitting elements 171 to the plurality of light receiving elements 173 through the touch area 115.

The optical guide portion 130 may have a hollow portion 131 formed in the center thereof, and may be in a rectangular shape that substantially corresponds to the display panel 110. The optical guide portion 130 is formed by an outer wall 133 surrounding an outline of the display panel 110 and an inner wall 135 arranged at an interval from the outer wall 133. In this case, the outer wall 133 that forms the outline of the optical guide portion 130 is in a closed loop shape, and the inner wall 135 is in a closed loop shape that is smaller than that of the outer wall 133. A drainage path 143 to be described later may be formed between the outer wall 133 and the inner wall 135 that form the closed loops as described above.

Further, the optical guide portion 130 has a lower wall 137 that is formed to extend from the lower ends of the outer wall 133 and the inner wall 135. The lower wall 137 of the guide portion 130 is positioned on the lower side of the frame portion 150 that supports the display panel 110.

Figure 5:
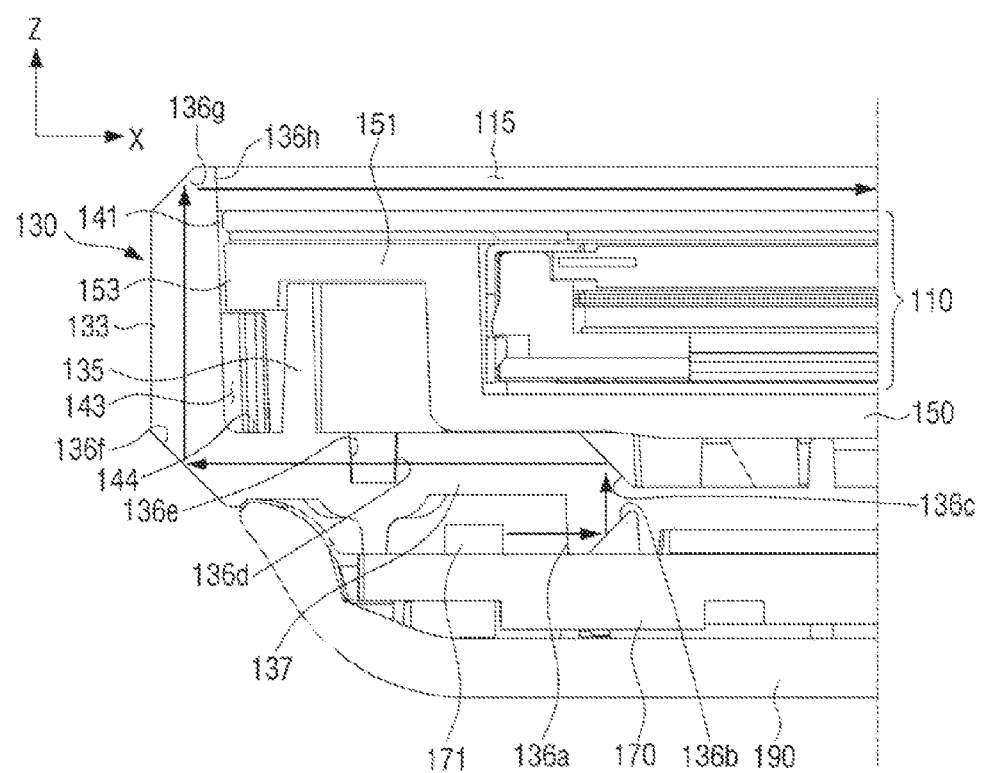
FIG. 5 is a cross-sectional view taken along line V-V of FIG. 3.

The optical guide portion 130 is formed of a transparent material that can transmit light. The optical guide portion 130 changes the direction of light (infrared rays) emitted from the plurality of light emitting elements 171 installed on the printed circuit board 170 multiple times to guide the emitted light to the touch area 115, and then guides the light of the touch area 115 to the plurality of light receiving elements 173. As illustrated in FIG. 5, such an optical guide structure includes a first light diffusion portion 136a formed on the lower wall 137 of the optical guide portion 130, a first reflection portion 136b, a second reflection portion 136c, a second diffusion portion 136d, and a first permeation portion 136e. The optical guide structure further includes a third reflection portion 136f formed on the outer wall 133 of the optical guide portion 130, a fourth reflection portion 136g, and a second permeation portion 136h.

An optical guide path that is formed by the optical guide structure as described above is as follows. The light emitted from the light emitting elements 171 is directed to the first reflection portion 136b along +X-axis direction. In this case, since the first diffusion portion 136 forms a curved surface that is curved from left to right, the light may be diffused as passing through the first diffusion portion 136. The light that is reflected by the first reflection portion 136b is directed to the second reflection portion 136c along +Z-axis direction. The light that is reflected by the second reflection portion 136c is directed to the third reflection portion 136f after successively passing through the second diffusion portion 136d and the first permeation portion 136e along −X-axis direction. In this case, the second diffusion portion 136d may form a curved surface that is curved from right to left, and the first permeation portion 136e may form a plane. The light that is reflected from the third reflection portion 136f is directed to the fourth reflection portion 136g along +Z-axis direction, and then the light that is reflected by the fourth reflection portion 136f is output to the touch area 115 through the second permeation portion 136h along +X-axis direction.

The light emitted from the left side T1 and the lower side T2 of the display device 100 to the touch area 115 is directed to the right side R1 and upper side R2 of the display device 100. In this case, the light that is emitted to the touch area 115 may be incident to the plurality of light receiving elements 173 through the optical guide structure positioned on the right side R1 and the upper side R2 of the display device 100. The optical guide structure may be formed in the same manner as the above-described optical guide structure positioned on the left side T1 and the lower side T2 of the display device 100 as described above.

However, the optical guide path of the optical guide portion 130 according to the present disclosure is not limited to the structure illustrated in FIG. 5, and various paths may be formed in accordance with the arrangement of the plurality of light emitting elements 171 or the standards (size, brightness, and the like) of the light emitting elements 171.

On the other hand, the present disclosure has a drainage structure that guides water or beverage that is spilled onto the touch area 115 due to a user's mistake through the interior of the display device 100 and then discharges the guided water or beverage out of the display device 100. Hereinafter, referring to FIGS. 6 to 10, the drainage structure of the present disclosure will be described.

Figure 6:
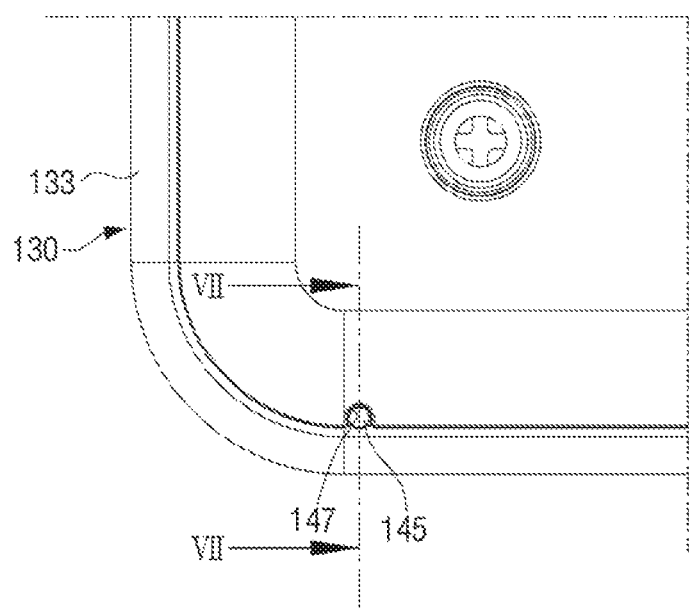
FIG. 6 is an enlarged view illustrating a drainage hole portion of a display device according to an exemplary embodiment of the present disclosure.
Figure 7:
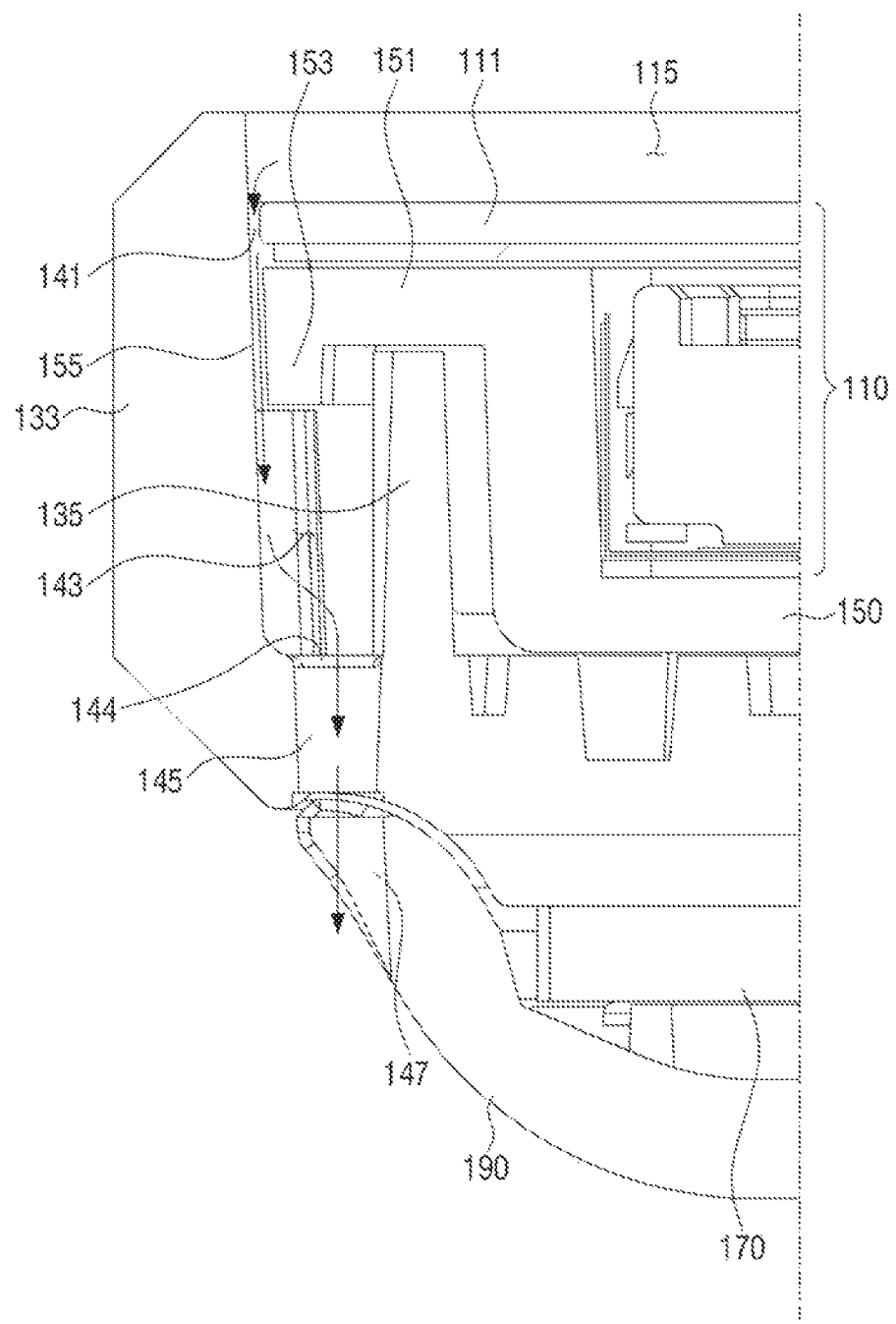
FIG. 7 is a cross-sectional view taken along line VII-VII of FIG. 6.

Referring to FIGS. 6 and 7, the drainage structure may include a gap 141 formed between the side end portion of the display panel and the outer wall 133 of the optical guide portion 130 surrounding the side end portion of the display panel, a drainage path 143 formed between the outer wall 133 and the inner wall 135 of the optical guide portion 130, and at least one drainage hole 145 formed on the optical guide portion 130 as shown in FIG. 7 and penetratingly formed on a bottom 144 of the drainage path 143. Further, the drainage structure may further include a drainage guide groove 147 configured to guide the liquid that is discharged from the drainage hole 145 out of the display device 100. In this case, the drainage guide groove 147 is formed on the rear cover 190.

The gap 141 may be formed between four sides of the display panel 110 and the outer wall 133 of the optical guide portion 130. In this case, the gap 141 may be in a predetermined closed loop shape. However, the gap 141 is not limited thereto, but may be formed only between any one of the four sides of the display panel 110 and the outer wall 133 of the optical guide portion 130 corresponding to the one side.

The gap 141 has a width enough to make a liquid, such as a beverage, that is spilled onto the touch area 115 flow into the gap 141, and the gap 141 is positioned on the upper side of the drainage path 143 so that the liquid can flow toward the drainage path 143.

In this case, a border 151 of the frame portion 150 that supports the display panel 110 as shown in FIG. 7 is arranged between glass 111 arranged on the upper side of the display panel 110 and an upper end of the inner wall 135 of the optical guide portion 130. Accordingly, the inner wall 135 of the optical guide portion 130 and the border 151 of the frame portion 150 can prevent the liquid that flows into the drainage path 143 through the gap 141 from flowing into the area in which the printed circuit board 170 that is vulnerable to water is arranged. In this case, for more efficient waterproofing, a sealing member (not illustrated) may be arranged between the inner wall 135 of the optical guide portion 130 and the border 151 of the frame portion 150.

Further, an end portion 153 of the border 151 is spaced apart from the outer wall 133 of the optical guide portion 130 at a predetermined interval, and thus another gap 155 may be formed between the end portion 153 and the outer wall 133 of the optical guide portion 130. Accordingly, the liquid that flows into the gap 141 can be guided toward the drainage path 143 along the other gap 155.

Referring to FIG. 8, the drainage path 143 is arranged to form a closed loop along the four sides of the optical guide portion 130. Accordingly, the liquid that flows into the drainage path 143 through the gap 141 may be guided to the drainage hole 145 along the drainage path 143.

On the other hand, in the case where the gap 141 is formed only on any one of the four sides of the display device 100, the drainage path 143 may be formed only on the one side of the optical guide portion 130 that corresponds to the gap 141. In the present disclosure, it is exemplified that the display device 100 is in a rectangular shape, but is not limited thereto. The display device 100 may be in the shape of a polygon, such as a triangle or an octagon, a circle, or an ellipse. In relation to the shape of the display device 100 as described above, it is preferable that the outer shapes of the display panel 110, the optical guide portion 130, the frame portion 150, the printed circuit board 170, and the rear cover 190 are formed to correspond to the shape of the display device 100.

Further, in the case where the display device 100 is in any one of various shapes as described above, the drainage hole 145 may be formed on any one portion of the optical guide portion 130.

Figure 9A:
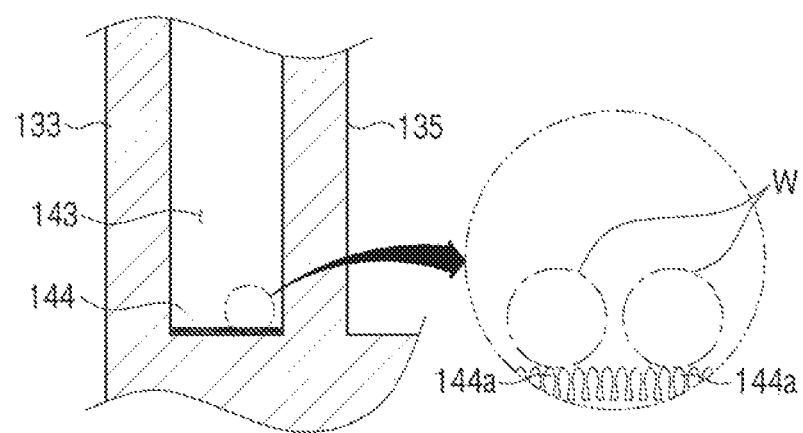
FIG. 9A is a cross-sectional view illustrating a plurality of micro-projections formed on a bottom of a drainage path.

Referring to FIG. 9A, the drainage path 143 has a furrow structure that is formed by the outer wall 133 and the inner wall 135 of the optical guide portion 130 and the bottom 144 of the drainage path 143. In this case, a plurality of micro-projections 144a are formed on the bottom 144 of the drainage path 143 so that the liquid does not form on the bottom 144 of the drainage path 143 due to surface tension using a lotus effect, and thus drainage efficiency can be maximized.

Figure 9B:
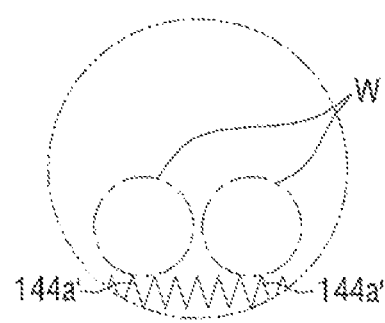
FIG. 9B is a cross-sectional view illustrating an example of cone-shaped upper portions of a plurality of micro-projections formed on a bottom of a drainage path.

The plurality of micro-projections 144a minimize the contact area with liquid drops W on the bottom 144 of the drainage path 143, and thus the liquid drops W can smoothly flow toward the drainage hole 145 without forming on the bottom 144. The plurality of micro-projections 144a may be formed through a secondary surface processing, such as a surface corrosion process, spray, or sand blast. In addition, it is preferable that upper portions of the plurality of micro-projections 144a are rounded to minimize the contact area with the liquid drops. However, the shapes of the upper portions of the plurality of micro-projections 144a are not limited thereto, but may be in a cone shape (circular cone or polygonal cone) as shown in FIG. 9B. Further, the plurality of micro-projections 144a may be formed in various shapes in addition to the round or cone shape through the secondary surface processing, such as the surface corrosion processing, spray, or sand blast.

Figure 10:
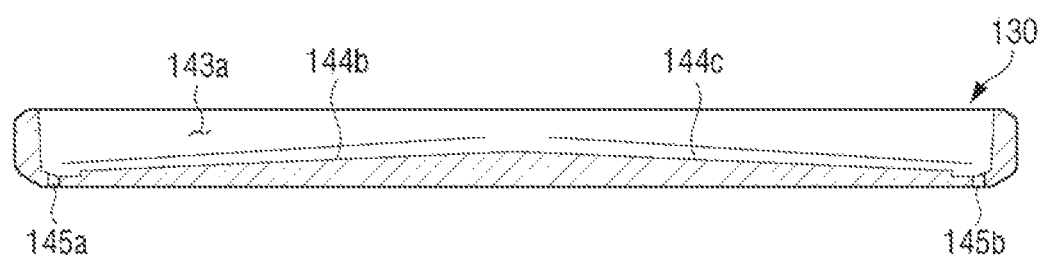
FIG. 10 is a cross-sectional view taken along line X-X of FIG. 8.
Figure 11:
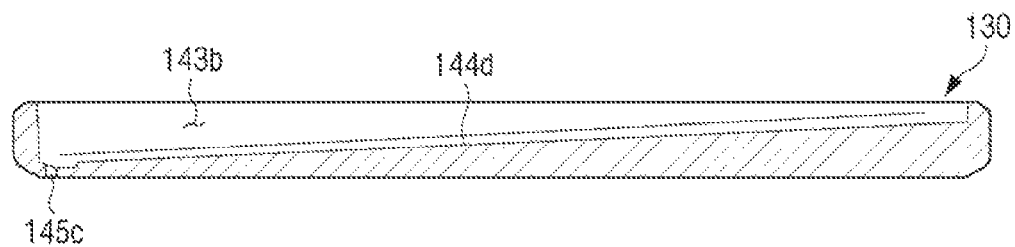
FIG. 11 is a cross-sectional view illustrating another example of a bottom of a drainage path illustrated in FIG. 10.

Referring to FIG. 10, the bottoms 144b and 144c of the drainage path 143a may be formed to be inclined downwardly on both sides toward the drainage holes 145a and 145b in order to more smoothly guide the liquid that flows into the drainage path 143 toward the drainage grooves 145a and 145b. Further, referring to FIG. 11, the bottom 144b of the drainage path 143b may be formed to be inclined downwardly from one side to the other side toward the drainage hole 145c.

Referring again to FIGS. 7 and 8, the drainage hole 145 is formed on the bottom 144 of the drainage path 143 to communicate with the drainage path 143. The drainage hole 145 may be arranged on one portion of the drainage path 143 that corresponds to at least two of four corners of the optical guide portion 130. However, the position of the drainage hole 145 is not limited thereto. The drainage hole 145 may be arranged in the positions of the drainage path 143 corresponding to the four corners of the optical guide portion 130, or may be formed in at least one position of the drainage path 143. It is preferable that, in accordance with the position of the drainage hole 145, the bottom 144 of the drainage path 143 is formed to be inclined toward the drainage hole 145.

Figure 12:
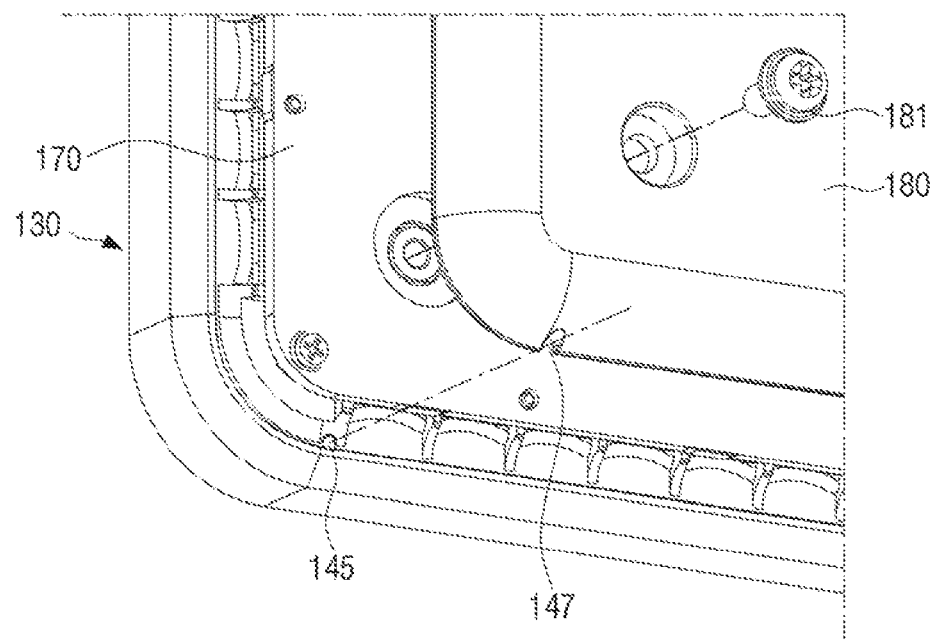
FIG. 12 is an exploded perspective view illustrating a rear cover that is separated from a display device.

Referring to FIG. 12, the drainage guide groove 147 may be formed on a part of the outline of the rear cover 190. In this case, once the rear cover 190 is fastened to the printed circuit board 170 through a fastening screw 181, the drainage guide groove 147 is set to a position that corresponds to the drainage hole 145. Accordingly, the liquid that flows from the touch area 115 to the drainage path 143 through the gap 141 is guided to the drainage hole 145 along the drainage path 143, and then is discharged out of the display device 100 through the drainage guide groove 147.

On the other hand, a typical vibrator 210 may be used to further expedite the drainage that is performed through the drainage structure according to the present disclosure. The vibrator 210 may be a micro-actuator or a piezoelectric device.

Figure 13:
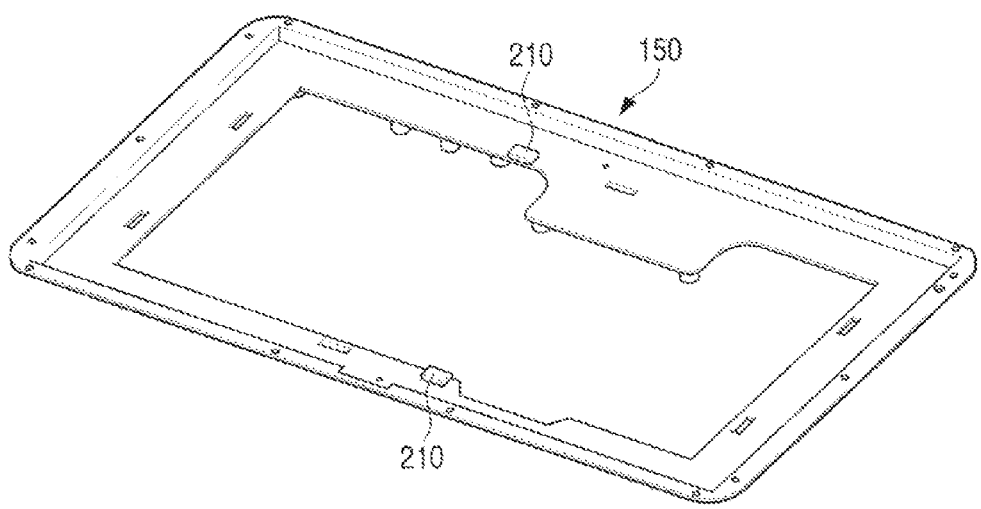
FIG. 13 is a perspective view illustrating an example of a vibrator installed on a frame portion that supports a display panel.

Referring to FIG. 8, the vibrator 210 may be fixedly installed on both sides of the optical guide portion 130 to generate and transfer vibration of a predetermined level to the display device 100, and thus the liquid can be smoothly drained through the drainage structure. The installation position of the vibrator 210 is not limited to the optical guide portion 130. In addition, the vibrator 210 may be installed on both sides of the frame portion 150 as shown in FIG. 13, or may be installed on one portion of the inside of the rear cover 190 although not illustrated.

In the case of applying the vibrator 210, if a small amount of liquid exists on the touch area 115 and a predetermined amount of light is not received by the plurality of light receiving elements 173, a controller (not illustrated) operates the vibrator 210 to provide vibration to the display device 100. Due to such vibration, the liquid that exists on the touch area 115 flows into the gap 141 and is discharged to the drainage hole 145 through the drainage path 143. In this case, if the liquid on the touch area 115 is removed and thus a predetermined amount of light is received by the plurality of light receiving elements 173, the controller stops the operation of the vibrator 210. As described above, once the vibrator 210 is applied, the liquid on the touch area 115 can be automatically sensed and removed.

Figure 14:
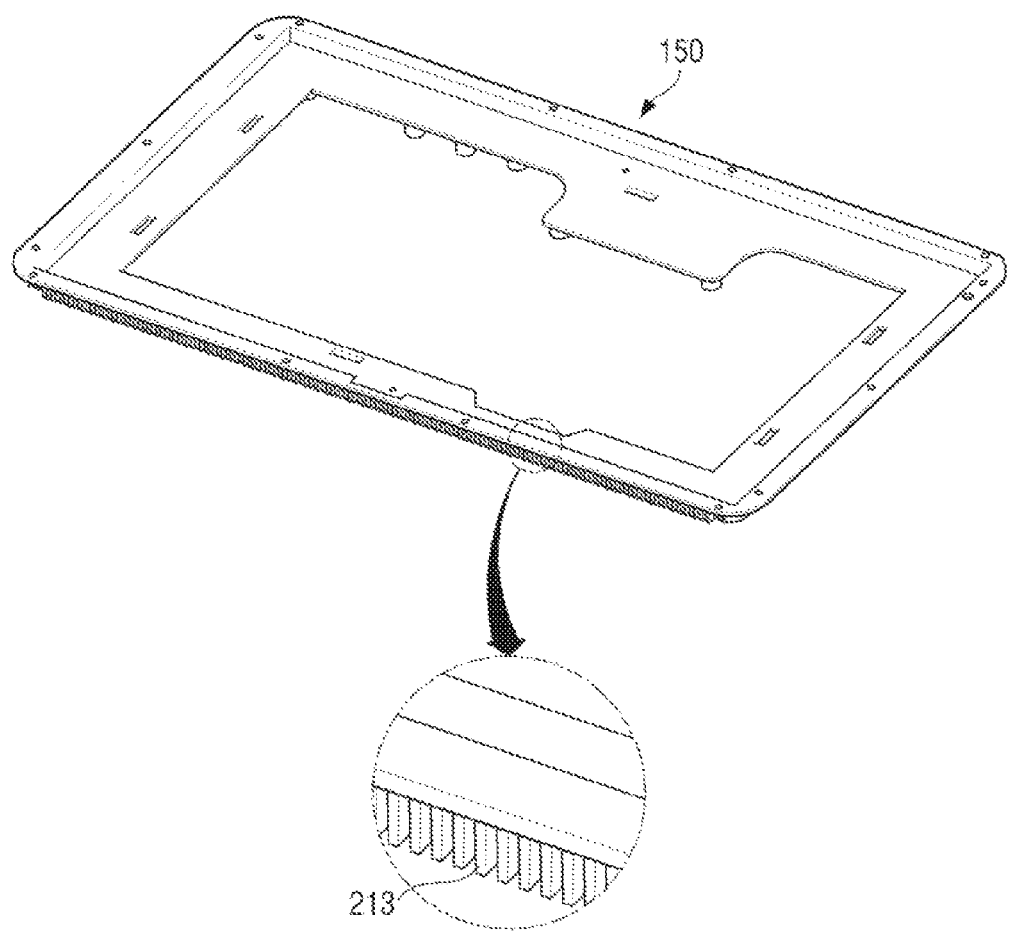
FIG. 14 is a perspective view illustrating a plurality of resonance ribs formed on a frame portion that supports a display panel.
Figure 15:
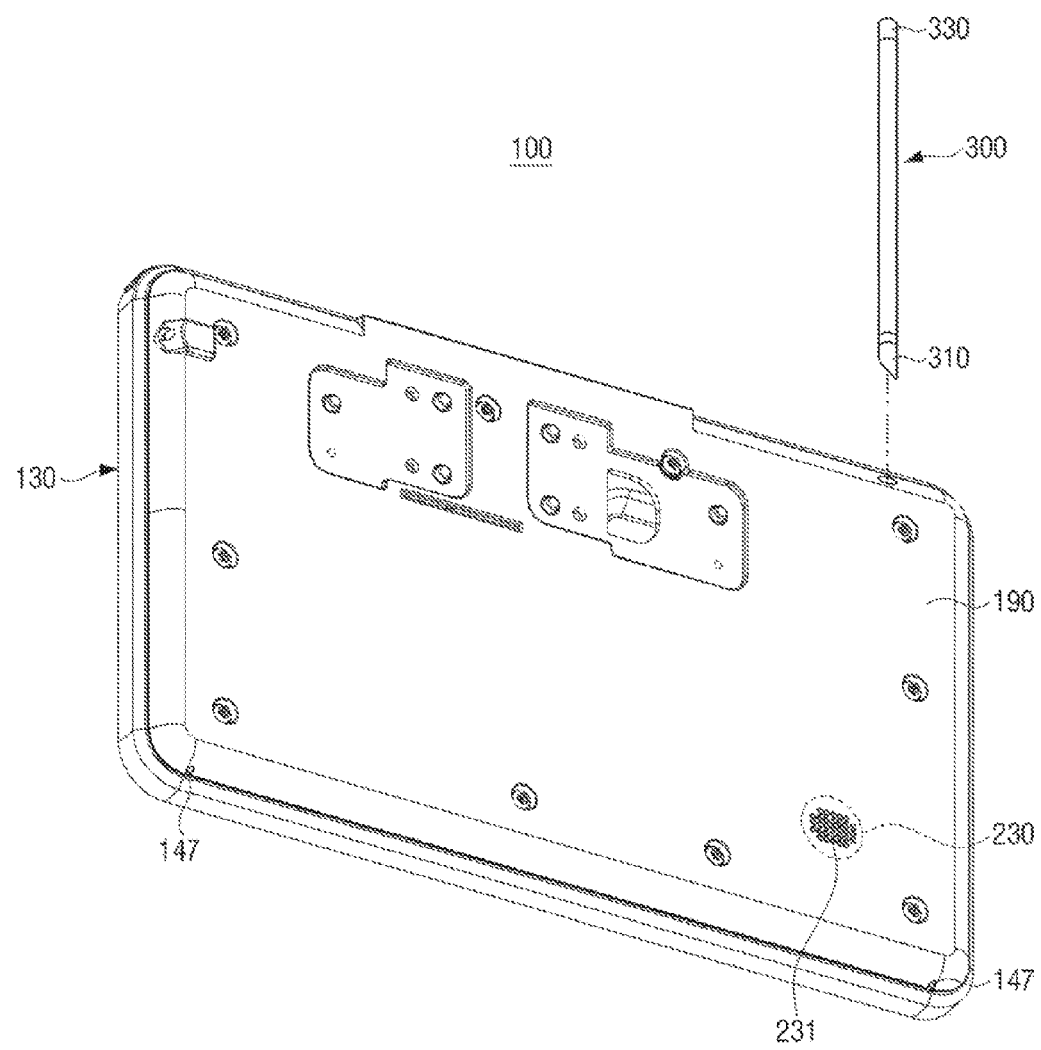
FIG. 15 is a perspective view illustrating a display device and a foreign substance removing member provided thereon according to an embodiment of the present disclosure.

According to the present disclosure, instead of removing the liquid on the touch area 115 using the vibration of the vibrator 210 as described above, vibration may also be generated through a resonance phenomenon to vibrate the display device 10. For example, a plurality of resonance ribs 213 may be formed at predetermined intervals along at least one of four sides of the frame portion 150 as shown in FIG. 14. In this case, the plurality of resonance ribs 213 resonate with specific sound waves (e.g., sound waves of 1200 Hz) output from a speaker 230 (see FIG. 15) that is arranged inside the display device 100 to cause vibration. In this case, it is preferable that the specific sound waves are set to have a predetermined resonance frequency enough to vibrate the resonance ribs 213 in accordance with the shape and the number of the resonance ribs 213. In FIG. 15, the unexplained reference numeral "231" denotes a speaker hole to discharge the sound output from the speaker 230 out of the display device 100.

Referring again to FIG. 3, the plurality of light emitting elements 171 are provided on one surface of the printed circuit board 170, and may be arranged at intervals in a line on the left and lower sides of the printed circuit board 179 so that the light emitting elements 171 are positioned on the left side T1 and the lower side T2 of the display device 100. Further, the plurality of light receiving elements 173 are provided on one surface of the printed circuit board 170, and may be arranged at intervals in a line on the right and upper sides of the printed circuit board 179 so that the light receiving elements 173 are positioned on the right side R1 and the upper side R2 of the display device 100.

Hereinafter, referring to FIGS. 15 to 17, a foreign substance removing member 300 for removing foreign substances accumulated on the corner portion on which the optical guide portion 130 and the display panel 110 meet each other will be described.

Referring to FIG. 15, the foreign substance removing member 300 may be separably inserted into the display device 100. The foreign substance removing member 300 may be thin and long, like a pen, so that a user can easily grasp the member.

Further, the foreign substance removing member may have a scraper 310 provided at one end portion thereof to scrape off the foreign substances and a writing portion 330 provided at the other end portion thereof and having a pressure-function like a typical electronic pen that is used for the touch screen panel. Accordingly, the foreign substance removing member 300 can perform the function of the electronic pen as well as removal of the foreign substances.

Figure 16:
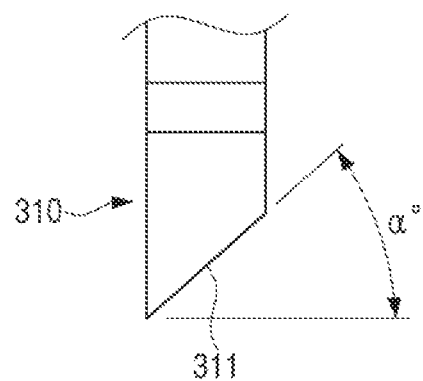
FIG. 16 is a partially enlarged view illustrating a scraper of the foreign substance removing member illustrated in FIG. 15.
Figure 17:
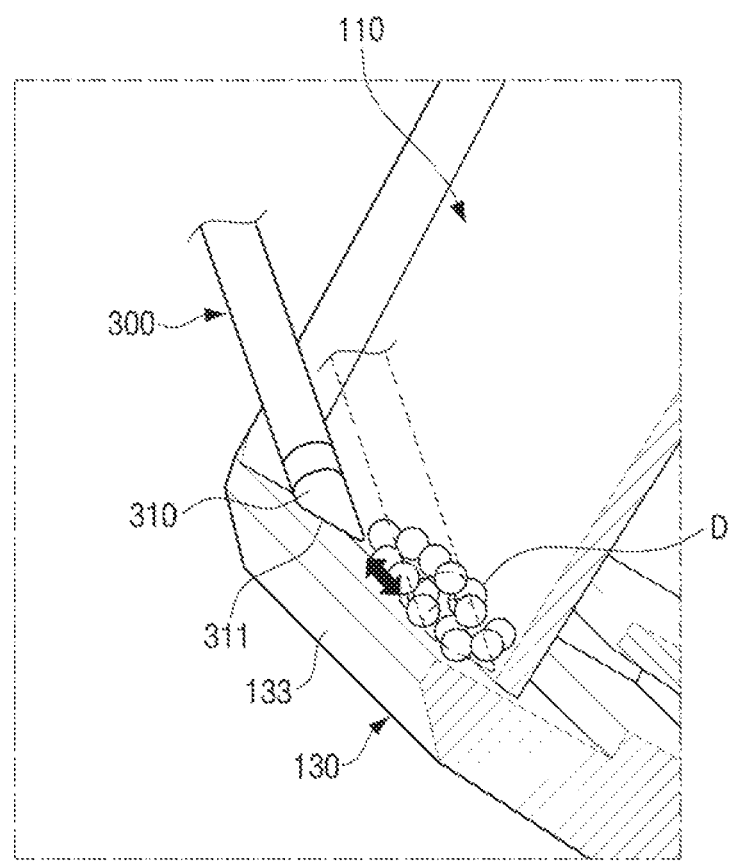
FIG. 17 is a schematic view illustrating a state where foreign substances accumulated on a corner portion on which an optical guide portion and a touch screen panel of a display device meet each other are removed by a foreign substance removing member of an electronic pen.

Referring to FIG. 16, it is preferable that the scraper 310 is made of a flexible material, such as rubber, so as to prevent scratches from occurring on the display panel 110 and the optical guide portion 130 when the scraper 310 scrapes the foreign substances D.

Further, the scraper 310 is formed so that a contact end 311 thereof has a predetermined inclination angle α. In this case, the inclination angle α may be set to be equal to or larger than 0°, which is enough to easily remove the foreign substances D accumulated on the corner portion on which the optical guide portion 130 and the display panel 110 meet each other as shown in FIG. 17.

Further, in the case where the foreign substances or liquid that cause a touch error exist on the touch area 115 and thus light is not received or a small amount of light is received in the plurality of light receiving elements 173 for a predetermined time, the controller may display a cleaning guide phrase on the display panel 110 or may output cleaning guide announcement through the speaker 230.

In addition, the present disclosure may be applied to an ATM device or Kiosk, and may be installed in an image forming apparatus to display various kinds of content, such as print information. Further, the present disclosure may also be applicable to a mobile device, such as a tablet PC.

While the present disclosure has been described in connection with the specific embodiments illustrated in the drawings, they are merely illustrative, and the present disclosure is not limited to these embodiments, but various equivalent modifications and variations of the embodiments can be made by a person having an ordinary skill in the art to which the present disclosure pertains. Accordingly, the scope of the present disclosure should not be limited to the exemplary embodiments as described above, but should be defined by not only the claims to be described alter but also equivalents of the claims.

What is claimed is:

1. A display device comprising:
a display panel; and
an optical guide portion surrounding the display panel, surrounding a touch area on the display panel, and disposed such that a gap, open to an exterior of the display device to receive liquid from a surface of the touch area, is located between the optical guide portion and at least a portion of an outer edge of the display panel, the optical guide portion comprising
a drainage hole, and
a drainage path configured to receive the liquid when the liquid has flowed into the gap and to guide the liquid to the drainage hole,
wherein the display device is configured to sense a touch on the touch area by detecting interception of light, having been output through the optical guide portion, passing through the touch area.

2. The display device as claimed in claim 1, wherein the drainage hole is formed through a portion of the optical guide portion.

3. The display device as claimed in claim 1, further comprising:
a rear cover forming a rear portion of the display device, the rear cover having a drainage guide groove formed thereon to guide liquid discharged from the drainage hole out of the display device.

4. The display device as claimed in claim 1, wherein the drainage path has a furrow structure formed by an outer wall of the optical guide portion, which forms an outline of the optical guide portion, and an inner wall of the optical guide portion arranged at an interval from the outer wall.

5. The display device as claimed in claim 1, wherein the drainage path has a plurality of micro-projections formed on a bottom of the drainage path.

6. The display device as claimed in claim 5, wherein the plurality of micro-projections have upper portions having a round or cone form that reduces a contact area between liquid drops and the drainage path.

7. The display device as claimed in claim 1, wherein the drainage path has a bottom surface that is downwardly inclined toward the drainage hole.

8. The display device as claimed in claim 1, further comprising a vibrator to vibrate the display panel.

9. The display device as claimed in claim 8, further comprising a frame portion that supports the display panel, wherein the vibrator is fixedly installed on the frame portion.

10. The display device as claimed in claim 8, wherein the vibrator is fixedly installed on the optical guide portion.

11. The display device as claimed in claim 1, further comprising:

a frame portion arranged between the optical guide portion and the display panel;

a speaker arranged inside the display device to vibrate the optical guide portion; and a plurality of resonance ribs formed on a part of the frame, and configured to resonate with sound waves generated from the speaker to vibrate the optical guide portion.

12. The display device as claimed in claim 1, further comprising a foreign substance removing member separably inserted into the display device and configured to remove foreign substances accumulated on a corner portion at which the optical guide portion and the display panel meet each other.

13. The display device as claimed in claim 12, wherein the foreign substance removing member has a scraper provided at one end portion thereof, and the scraper has an inclined contact end.

14. The display device as claimed in claim 13, wherein the scraper is made of a flexible material.

15. The display device as claimed in claim 12, wherein the foreign substance removing member has a writing portion provided at another end portion thereof and having a pressure-function.

16. An electronic device comprising:

a display panel;

an optical guide portion surrounding the display panel and surrounding a touch area on the display panel; and a drainage structure configured to discharge a liquid that is spilled or placed onto the display panel to an outside of the electronic device through an interior of the electronic device, the drainage structure including a gap formed between the display panel and the optical guide portion surrounding the display panel, the gap being open to an exterior of the display device to receive the liquid spilled or placed onto the display panel, a drainage hole formed on the optical guide portion, and a drainage path configured to receive the liquid when the liquid has flowed into the gap and to guide the liquid to the drainage hole, wherein the display device is configured to sense a touch on the touch area by detecting interception of light, having been output through the optical guide portion, passing through the touch area.

17. The electronic device as claimed in claim 16, further comprising a rear cover forming a rear portion of the display device, the rear cover having a drainage guide groove formed thereon to guide liquid discharged from the drainage hole out of the display device.

18. The electronic device as claimed in claim 16, wherein the drainage path has a furrow structure formed by an outer wall of the optical guide portion, which forms an outline of the optical guide portion, and an inner wall of the optical guide portion arranged at an interval from the outer wall, and the drainage path has a plurality of micro-projections formed on a bottom of the drainage path.

19. The electronic device as claimed in claim 16, wherein the drainage path has a bottom surface that is downwardly inclined toward the drainage hole.

20. The electronic device as claimed in claim 16, further comprising a vibrator that vibrates the display panel.

* * * * *